US012503624B2

(12) United States Patent
Scheltjens et al.

(10) Patent No.: US 12,503,624 B2
(45) Date of Patent: Dec. 23, 2025

(54) METHOD FOR ALTERING ADHESION PROPERTIES OF A SURFACE BY PLASMA COATING

(71) Applicant: MOLECULAR PLASMA GROUP S.A., Foetz (LU)

(72) Inventors: Gill Scheltjens, Boom (BE); Joanna Borek-Donten, Arlon (BE); Régis Heyberger, Thionville (FR)

(73) Assignee: MOLECULAR PLASMA GROUP S.A., Foetz (LU)

( * ) Notice: Subject to any disclaimer, the term of this patent is extended or adjusted under 35 U.S.C. 154(b) by 0 days.

(21) Appl. No.: 17/789,643

(22) PCT Filed: Jan. 7, 2021

(86) PCT No.: PCT/EP2021/050176
§ 371 (c)(1),
(2) Date: Jun. 28, 2022

(87) PCT Pub. No.: WO2021/140146
PCT Pub. Date: Jul. 15, 2021

(65) Prior Publication Data
US 2023/0066187 A1 Mar. 2, 2023

(30) Foreign Application Priority Data
Jan. 7, 2020 (EP) ..................... 20150628

(51) Int. Cl.
*B05D 1/00* (2006.01)
*B05D 3/14* (2006.01)
(Continued)

(52) U.S. Cl.
CPC ..................... *C09J 5/02* (2013.01);
*B05D 1/62* (2013.01); *B05D 3/142* (2013.01);
*B29C 70/683* (2013.01);
(Continued)

(58) Field of Classification Search
None
See application file for complete search history.

(56) References Cited

U.S. PATENT DOCUMENTS 7,067,405 B2  6/2006 Mikhael et al.
8,178,168 B2  5/2012 O'Neill et al.
(Continued)

FOREIGN PATENT DOCUMENTS

CN  1643997 A  7/2005
CN  101048237 A  10/2007
(Continued)

OTHER PUBLICATIONS

Watanabe et al., "Atmospheric Plasma Deposition of Transparent Semiconducting ZnO Films on Plastics in Ambient Air," Organic Electronics, vol. 15, No. 3, Amsterdam, NL, Jan. 18, 2014, pp. 775-784.
(Continued)

*Primary Examiner* — Jose I Hernandez-Kenney
(74) *Attorney, Agent, or Firm* — Workman Nydegger (57) ABSTRACT

A method for altering adhesion properties of a surface of a substrate by a coating, comprising the steps of: a) ionizing a plasma gas at low temperature and at atmospheric pressure, thereby creating a plasma with a plasma temperature of at most 50° C.; b) introducing a precursor into a plasma gas afterglow of the plasma; c) subjecting the surface of the substrate to the plasma including the precursor, thereby forming a coating onto the surface. The plasma gas is essentially completely comprised of inert gas. The coating alters the adhesion properties of the surface.

14 Claims, 2 Drawing Sheets

(51) Int. Cl.
  *B29C 70/68* (2006.01)
  *C09J 5/02* (2006.01)
  *D06M 10/02* (2006.01)
  *D06M 14/30* (2006.01)
  *D06M 15/693* (2006.01)
  *D06M 101/32* (2006.01)
  *D06M 101/36* (2006.01)

(52) U.S. Cl.
  CPC .......... *D06M 10/025* (2013.01); *D06M 14/30* (2013.01); *D06M 15/693* (2013.01); *B05D 2201/00* (2013.01); *B05D 2256/00* (2013.01); *C09J 2475/00* (2013.01); *D06M 2101/32* (2013.01); *D06M 2101/36* (2013.01)

(56) References Cited

U.S. PATENT DOCUMENTS

| | | | |
|---|---|---|---|
| 8,552,335 | B2 | 10/2013 | Rego et al. |
| 9,406,485 | B1 | 8/2016 | Cheng et al. |
| 2004/0247886 | A1* | 12/2004 | Kudo ................ C23C 16/45595 428/421 |
| 2005/0020038 | A1* | 1/2005 | Mikhael ............ H01J 37/32724 438/485 |
| 2005/0178330 | A1 | 8/2005 | Goodwin et al. |
| 2008/0308535 | A1* | 12/2008 | Rego ................... H05H 1/2406 219/121.52 |
| 2009/0068375 | A1* | 3/2009 | Dobbyn ................ C23C 4/134 427/569 |
| 2009/0202739 | A1 | 8/2009 | O'Neill et al. |
| 2009/0220794 | A1* | 9/2009 | O'Neill ................... C23C 4/18 428/447 |
| 2013/0280539 | A1* | 10/2013 | Wilken .................... B05D 1/62 428/447 |
| 2017/0050214 | A1* | 2/2017 | Boscher ............ H01J 37/32348 |
| 2017/0130396 | A1 | 5/2017 | Cevahir et al. |
| 2020/0020953 | A1* | 1/2020 | Regula ................. H01M 4/136 |

FOREIGN PATENT DOCUMENTS

| | | |
|---|---|---|
| CN | 101129100 A | 2/2008 |
| CN | 106460313 A | 2/2017 |
| EP | 1493309 A1 | 10/2003 |
| EP | 1807221 A1 | 7/2007 |
| WO | 2006081637 A1 | 8/2006 |

OTHER PUBLICATIONS

Extended European Search Report from corresponding European Application No. 20150628.4, Oct. 16, 2020.
International Search Report from corresponding PCT Application No. PCT/EP2021/050176, Jun. 29, 2021.
Second Written Opinion from corresponding PCT Application No. PCT/EP2021/050176, Dec. 9, 2021.
International Preliminary Report on Patentability from corresponding PCT Application No. PCT/EP2021/050176, Mar. 21, 2022.
Chinese Office Action from corresponding Application No. 202180008462.6, Aug. 14, 2023.
European Office Action from Corresponding European Patent Application No. EP21701222.8, Dec. 20, 2023.
Chinese Office Action from Corresponding Chinese Patent Application No. CN202180008462.6, Dec. 23, 2023.

* cited by examiner

METHOD FOR ALTERING ADHESION PROPERTIES OF A SURFACE BY PLASMA COATING

TECHNICAL FIELD

The present invention relates to a method for altering adhesion properties of a surface by plasma coating. The plasma coating is applied using a low temperature plasma at or around atmospheric pressure. Technical field of interest are given by CPC classification D06M10/025 and B05D1/62.

BACKGROUND OF THE INVENTION

In many industrial applications, it may be necessary to alter surface properties of materials. One particular property of a surface is the strength with which it adheres to another surface. The other surface can be made from the same material or another material. In some applications it may be necessary to increase the adhesion between two surfaces, such as in gluing applications. In other applications it may be necessary to decrease adhesion between two surfaces, e.g. to avoid sticking or expel water or oily substances.

Many techniques have been tried and tested to change the adhesion properties of surfaces. In many applications it may be sufficient to subject the surface to an etching, cleaning, and/or activation procedure, in order to obtain the desired adhesion properties. However, these type of operations may not be sufficient in applications which require a drastic alteration of the adhesion properties.

One way of altering the adhesion properties of a surface is to apply a coating onto the surface. Coating layers can be deposited in a number of ways. Currently, the majority of coating techniques make use of 'wet coating', whereby a surface is subjected to a liquid solution containing the coating material. Such wet coating techniques suffer from a number of drawbacks such as:
- a long drying time;
- large amount of waste resulting in a large stress on the environment;
- homogeneity and conformality of the coating is not always as desired,
- thick coatings of 1 micrometer or larger may not be desirable.

A coating technique which has gained momentum in the last few decades is plasma coating. Hereby a precursor which is to form the coating on the surface of a substrate is brought at least partially in a plasma state, and the surface of the substrate is subjected to the plasmized precursor. As a result, the precursor can form strong bonds with the substrate and/or form cross-links between substance molecules, thereby resulting in a coating which may be thin, yet very durable, homogeneous and conformal. If the precursor is a polymerizable monomer, polymerisation may occur directly onto the surface of the substrate.

Plasma coating techniques may be divided into vacuum techniques which having an operating pressure which is significantly lower than atmospheric pressure, and into atmospheric techniques which operate at or near atmospheric pressure, for instance between 400 mbar and 1600 mbar, but preferably very close to atmospheric pressure e.g. between 950 mbar and 1050 mbar. The present invention relates to an atmospheric plasma technique, which presents a number of advantages over vacuum plasma techniques, such as that no time-consuming depressurizing step is required and that both batch processing and inline processing, whereby the one or more objects which are to be treated, are sequentially treated, are easily achievable.

Document U.S. Pat. No. 9,406,485B1 discloses an argon and helium plasma apparatus and method that operate with argon or helium at atmospheric pressure, and at low temperatures, and with high concentrations of reactive species in the effluent stream. Laminar gas flow is developed prior to forming the plasma and at least one of the electrodes is heated which enables operation at conditions where the argon or helium plasma would otherwise be unstable and either extinguish, or transition into an arc. The apparatus and method can be employed to remove organic materials from a substrate, thereby cleaning the substrate; activate the surfaces of materials thereby enhancing adhesion between the material and an adhesive; kill microorganisms on a surface, thereby sterilizing the substrate; etches thin films of materials from a substrate, and deposit thin films and coatings onto a substrate. In order to deposit a thin film, this process requires presence of a reactive species. The present inventors have found that the such reactive species does not allow to alter the adhesion properties in a controlled manner.

Document U.S. Pat. No. 7,067,405B2 discloses a plasma produced in a treatment space by diffusing a plasma gas at atmospheric pressure and subjecting it to an electric field created by two metallic electrodes separated by a dielectric material, a precursor material is mixed with the plasma, and a substrate film or web is coated by vapor deposition of the vaporized substance at atmospheric pressure in the plasma field. The deposited precursor is cured by electron-beam, infrared-light, visible-light, or ultraviolet-light radiation, as most appropriate for the particular material being-deposited. Plasma pre-treatment and post-treatment steps are used to enhance the properties of the resulting coated products. Similar results are obtained by atomizing and spraying the liquid precursor in the plasma field. It would seem that the method described in this document does not allow all types of precursors to be used. In particular, one can only use precursors which can be evaporated by heating. This typically rules out heavy precursors and/or particular substrates which may not be heated.

There remains a need in the art for an plasma coating process which allows to alter the adhesion properties of a surface in a controlled manner by coating said surface. The present invention aims to solve the problems indicated above, and in particular relates to a method which allows altering the adhesion properties in a controlled manner.

SUMMARY OF THE INVENTION

The present invention concerns a method for altering adhesion properties of a surface of a substrate by a coating in accordance with claim 1. The use of an inert gas as plasma gas essentially ensures that no reactions take place with the plasma gas and the equipment, between molecules of the plasma gas themselves, even not if temperature is increased. In fact, the lack of reactions also seems to allow to keep the plasma temperature low, e.g. less than 50° C. and preferably around room temperature. The low temperature of the plasma allows treatment of substrates made from a wide range of materials. Furthermore, this allows a better control over the formed coating and the adhesion properties thereof. Without wishing to be bound by theory, the inventors believe that the lack of reactive gas in the plasma gas ensures that none to very few chemical reactions with the plasma gas take place at the surface of the substrate, hence the better control over the adhesion properties. Also, if the plasma gas is nitrogen (N2) or is mainly comprised of N2, the low power applied to the plasma in embodiments of the present invention, are seen to result in very little to none nitrogen incorporated in the resulting coating. This is in stark contrast with the use of e.g. O2, NH3 or CH4 as a plasma gas, all of which are deemed reactive gasses, and all of which seem to leave more traces within the coating of the plasma gas, thereby leading to loss of control over the adhesion properties.

The altered adhesion properties of the surface by the coating imply that the coated surface has an increased or a decreased adhesion with respect to a second surface. As a consequence, the present invention can be applied to provide a gluing coating layer to the surface for allowing better adhesion to a second surface or a non-sticking coating layer to the surface to decrease sticking of the surface to a second surface, depending on the application of the present invention.

In a preferred embodiment, the precursor is added in a plasma gas afterglow. Hereby plasma gas flows over and between a plasma-inducing system, e.g. a set of electrodes. Downstream of the plasma-inducing system, a plasma gas afterglow is present, which comprises a large number of ionized plasma gas molecules which did not have the time to de-ionize. The precursor is preferably introduced in said plasma gas afterglow. As a result, the precursor does not need to be introduced in between e.g. electrodes which are used to ionize the plasma gas, and thus the electrodes may be kept clean for a long duration as the precursor cannot form a layer onto the electrodes. Furthermore, this allows a setup whereby the substrate does not have to be in or pass through a plasma zone, i.e. a zone where plasma is induced, e.g. the substrate does not have to be between or to pass in between the set of electrodes used to induce the plasma. Hence, in the present invention, the substrate preferably is not in a plasma zone and/or does not pass through a plasma zone. This further allows more different types of substrates to be treated, as they are not subjected to e.g. strong electromagnetic fields or to direct, high-intensity plasma.

In a preferred embodiment, said plasma gas comprises inert gas for at least 99% by volume, i.e. 1% by volume (vol. %) or less of the plasma gas is a reactive gas. More preferably at least 99.5 vol %, still more preferably at least 99.8 vol %, still more preferably at least 99.9 vol %, even more preferably at least 99.95 vol %, yet more preferably at least 99.99 vol % of the plasma gas is an inert gas. This means that the plasma gas preferably comprises 1 vol. % or less O2, more preferably at most 0.5 vol %, still more preferably at most 0.2 vol %, yet more preferably at most 0.1 vol %, still more preferably at most 0.05 vol %, even more preferably at most 0.01 vol % of O2. In the atmospheric plasma process of the present invention, this can for instance be achieved by using an overpressure with respect to ambient pressure, e.g. the plasma gas is delivered at a pressure of at least 1013 mbar, preferably at least 1020 mbar, more preferably at least 1030 mbar, even more preferably at least 1040 mbar, still more preferably at least 1050 mbar. Such slight overpressures allow to create an oxygen-poor and even oxygen-free zone in the plasma afterglow.

In a preferred embodiment, the plasma gas is ionized by means of electrodes, whereby more preferably said plasma gas is ionized by said electrodes with a power of at most 10 Watt per $cm^2$ of the electrode surface, more preferably at most 9 $W/cm^2$, still more preferably at most 8 $W/cm^2$, even more preferably at most 7.5 $W/cm^2$.

In many embodiments of the present invention, the power applied by the electrodes is minimally 1 $W/cm^2$, preferably minimally 2 $W/cm^2$, still more preferably minimally 2.5 $W/cm^2$. The power is most preferably between 2.5 and 7.5 $W/cm^2$.

As discussed before, the atmospheric plasma coating process of the present invention allows both batch processes and inline processes. Hence, in an embodiment, the substrate moves during step c and in another embodiment, the substrate is static during step c. In yet another embodiment, the substrate moves and remains static during step c according to a predetermined trajectory. This allows to provide e.g. a thicker coating on some portions of the surface of the substrate and thinner coating on other portions of said surface.

In an embodiment of the invention, the plasma gas flow is between 1 and 1500 standard liter per minute ("slpm"), more preferably between 50 and 1500 slpm. 1 "slpm" is a liter of the gas at atmospheric pressure and at room temperature. More preferably the plasma gas flow is between 80 slpm and 1000 slpm. Preferably the plasma gas comprising the precursor is jettisoned from an outlet of a plasma jet nozzle. In a preferred embodiment, the plasma gas flow is determined taking into account a distance between the surface of the substrate and the outlet of a plasma jet nozzle. The larger such distance, the more plasma gas flow is required to ensure that the surface is subjected to a plasma without reactive gasses other than the used precursor. In particular, one can ensure that the plasma is essentially free of oxygen coming from e.g. the surrounding air.

In an embodiment of the present invention, the substrate undergoes a plasma pre-treatment step prior to being subjected to the plasma comprising the precursor. This is preferably performed in case of extremely inert surfaces, such as glass, silicon wafers, gold, high performance engineering thermoplastics or thermosets, etc. Hereby, the plasma pre-treatment preferably activates the surface of the substrate, i.e. it generates surface radicals, and may also preferably a least partially oxidize the surface, leading to an increased surface energy in most cases.

In preferred embodiments, the pre-treatment is performed:
  in an oxygen-rich plasma environment, more preferably using air or CO2 or other oxygen containing species,
  at higher power compared to the power used during the plasma gas ionization step a), and/or
  without the addition of chemical precursors.

In embodiments of the present invention, the coated substrate undergoes an atmospheric plasma post-treatment step. Preferably during this post-treatment step, the molecular weight of the plasma film is increased and/or the thermal stability of the plasma film is increased.

In preferred embodiments, the plasma post-treatment is preformed:
  in absence of oxygen, using inert plasma gases, such as N2, Ar, of He (or mixtures thereof);
  at smaller plasma power than the power used during the plasma gas ionization step a), and/or without the addition of chemical precursors.

DETAILED DISCUSSION OF THE INVENTION AND ITS EMBODIMENTS

The present invention concerns a method for altering adhesion properties of a surface of a substrate by a coating, comprising the steps of:
a) ionizing a plasma gas at low temperature and at atmospheric pressure, thereby creating a plasma;
b) introducing a precursor into said plasma;
c) subjecting the surface of the substrate to said plasma comprising said precursor, thereby forming a coating onto said surface, whereby said plasma gas is essentially completely comprised of inert gas, and whereby said coating alters the adhesion properties of the surface.

In an embodiment, the adhesion is increased. In another embodiment, the adhesion is decreased. In yet another embodiment, the adhesion properties are altered according to a predetermined surface modification profile. Hereby, the adhesion properties may for instance be increased on a first portion of the surface and may be decreased on a second portion of the surface. Preferably the precursor is selected to increase the adhesion of the surface by the coating or the precursor is selected to de crease the adhesion of the surface by the coating. The present method allows to deposit a coating on a large number of substrates and using a large number of precursors, in particular due to the low temperature of the plasma, preferably of at most 50° C., and due to the preferable introduction of the precursor in the plasma afterglow. Hence, this allows a skilled person to easily test which precursors lead to a coating which increases adhesion of the surface and which precursors lead to a coating which decreases adhesion of the surface. This can be easily tested by applying the coated surface to a second surface and compare the adhesion strength between the coated surface to the second surface with the adhesion strength between the uncoated surface to the second surface. It should be clear that such procedure would not constitute an undue burden.

In a preferred embodiment, the precursor is introduced as an aerosol or as a gas.

In a preferred embodiment, the plasma gas comprises inert gas for at least 99 vol. %.

In a preferred embodiment, the plasma gas comprises O2 for at most 1% by volume.

In embodiments, the said inert gas is a noble gas, preferably Ar or He. In other embodiments, the inert gas is a non-noble gas, preferably N2. In yet other embodiments the inert gas is a gas mixture of inert gasses, such as noble gasses and/or inert non-noble gasses, e.g. a gas mixture of He, Ar and/or N2.

In a preferred embodiment, the plasma gas is ionized by means of electrodes, more preferably the plasma gas is ionized by said electrodes with a power of at most 10 Watt per $cm^2$ of the electrode surface, most preferably at most 7.5 $W/cm^2$.

The plasma deposition process of the present invention is based on the simultaneous generation of surface radicals (i.e. activation of the difficult-to-treat substrate) and radicalized species in the plasma gas phase, leading to radical recombination reactions of the species to the substrate (i.e. grafting based on covalent bonding). The chemical nature of the precursor can range from classic monomers to saturated molecules, from organic to inorganic molecules, from low molecular weight (e.g. monomers, oligomers) to high molecular weight (e.g. polymers being dissolved or emulsified).

Figure 1:
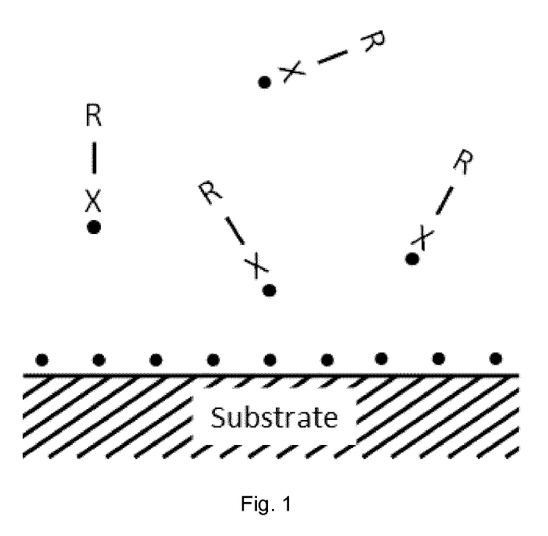
FIG. 1: at t=t0 the plasma is on. A precursor R—X is added to the plasma gas and the plasma is contacted with the substrate. Hereby the precursor R—X is radicalized, and the substrate is activated.

The scheme outlined in FIGS. 1 to 4 indicate the different phases during the atmospheric plasma deposition process:

FIG. 1: at t=t0 the plasma is on. A precursor R—X is added to the plasma gas and the plasma is contacted with the substrate. Hereby the precursor R—X is radicalized, and the substrate is activated.

Figure 2:
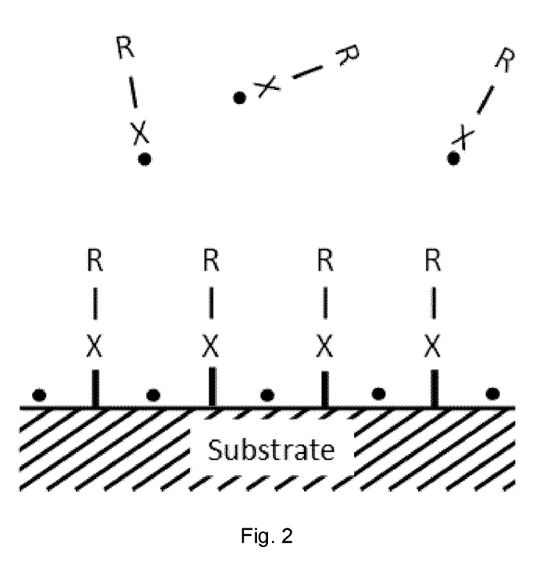
FIG. 2: at t=t1 the plasma is on. Radical recombination reactions are taking place on the surface, resulting in a covalent bond between substrate and precursor.

FIG. 2: at t=t1 the plasma is on. Radical recombination reactions are taking place on the surface, resulting in a covalent bond between substrate and precursor.

Figure 3:
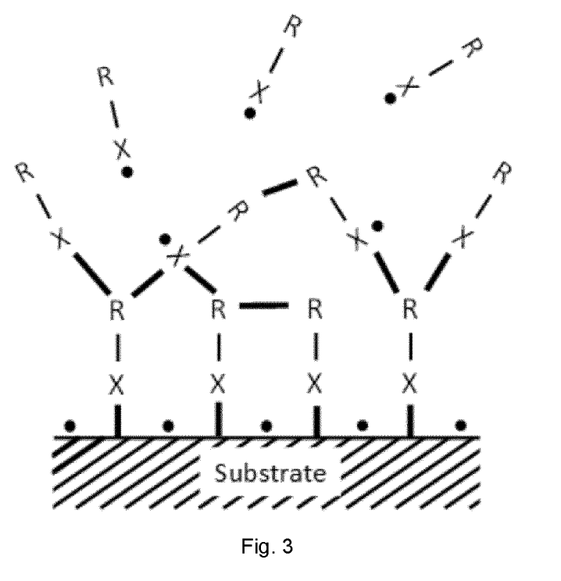
FIG. 3: at t=t2, the plasma is on. Film growth and thickness depend on treatment time. Also cross-linking is taking place.

FIG. 3: at t=t2, the plasma is on. Film growth and thickness depend on treatment time. Also cross-linking is taking place.

Figure 4:
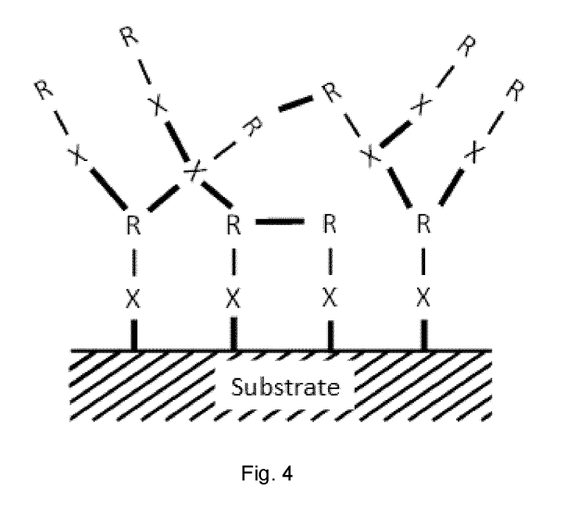
FIG. 4: at t=t3 the plasma is off. After the plasma treatment, a functional plasma deposited film remains which is grafted onto the substrate.

FIG. 4: at t=t3 the plasma is off. After the plasma treatment, a functional plasma deposited film remains which is grafted onto the substrate.

In Step 1, the plasma is generated (can be based on direct or indirect plasma configurations, using an inert plasma gas such as N2, Argon, Helium, or any mixtures thereof), instantaneously generating radicalized species in the plasma gas phase. These species can be added to the plasma as a gas (or gas mixture), or a liquid (e.g. an aerosol, a spray, a liquid mixture, an emulsion, a dispersion, or polymer solution), preferably as a gas or as an aerosol. In the scheme outlined in FIGS. 1-4, we used the connotation "R—X" to denote the initial precursor, and "R—X." the radicalized form of the precursor. "R" being the targeted functionality, and "X" being a part of the molecule being able to be radicalized. For example, "X" can be reactive (such as C═C double bonds, C═O, epoxy, isocyanate, . . . ), but can also be unreactive (i.e. saturated), in this specific case, the radical will be formed based on hydrogen abstraction.

In addition to the radicalized species in the gas phase, also surface radicals are formed on the substrate which is also in contact with the plasma. The generation of these surface radicals can be mainly based on hydrogen abstraction or breaking of covalent bonds located at the surface of the substrate.

In Step 2, radical recombination reactions are taking place between the radicalized species and surface radicals. This radical recombination reaction results in a permanent grafting of the precursor to the surface by the formation of a covalent bond. It must be remarked that presence of reactive gasses such as 02, needs to be avoided during this phase.

In Step 3, film growth is taking place by the continuous incorporation of species by radical recombination. It must be remarked that the plasma process is 'non-specific', meaning that a specific precursor can be built in on the surface on any location, leading to a heterogeneous conformation of the plasma deposited film on a molecular level. Furthermore, the film growth can take place in a 'continuous' plasma or in a 'pulsed' plasma process. This pulsed plasma has a specific plasma off time, where recombination reactions are favoured, similar to propagation in conventional polymer synthesis.

In the final phase of the plasma deposition process (Step 4), the plasma is switched off, or similarly the substrate has left the plasma afterglow zone, leading to a fully functional coating layer which is covalently linked to the substrate.

The resulting plasma deposited film has the following unique features:

Covalently bonded to the surface of the substrate;

Functional with respect to adhesion properties. For instance:
- (i) This functionality can be a reactive functional group that can participate in a curing reaction with a curable 'reactive' adhesive or topcoat. For example, primary amines or epoxies in the case of an epoxy-amine glue or topcoat, or hydroxyls or isocyanates in the case of a PU resin as glue or topcoat. In such an application, the applied coating increases adhesion of the surface to a glue or topcoat, which can further be used to attach the substrate to another component.
- (ii) This functionality can also be 'unreactive', simulating a similar chemistry as an 'unreactive' topcoat (e.g. a pressure sensitive adhesive or overmoulded thermoplastic). The target of the plasma deposited layer is to guarantee compatibility between the difficult-to-bond substrate and the unreactive topcoat, and facilitate chain entanglement between the plasma deposited film and the topcoat to increase the adhesion to the maximum.

Heterogeneous:

Compared to polymeric analogues having a distinct repeat unit, the plasma deposited film is heterogeneous in nature. This means that besides a main carbon chain in the polymeric backbone, also other elements can be incorporated (originating from the introduced precursor).

Cross-Linked:

During the film growth phase of the plasma deposited film, also radical sites are generated on the surface of the growing film itself. These radical sites are created randomly, leading to the creation of cross-links.

High Molecular Weight:

The molecular weight of the fully functional plasma deposited film is high (comparable to conventional thermosets), due to the cross-linked nature of the film. It must be remarked that the presence of $O_2$ needs to be avoided in the treatment area of the plasma process. When there is a significant amount of $O_2$ present (>100 ppm), radical recombination reactions will be quenched, leading to low molecular weight fragments residing in the plasma deposited film, having a plasticizing effect. Hence, in most preferred embodiments, the plasma gas comprises at most 0.01 vol % $O_2$.

Durable:

Due to the cross-linked nature and high molecular weight of the plasma deposited film, the durability of the film is greatly enhanced compared to conventional primers. Overall, it was tested that the time between the plasma deposition process and the application of an adhesive or topcoat can be extended to a period of minimum 6 months.

Dry:

After the plasma deposition process, the resulting film does not require any subsequent drying step. A subsequent curing step may also not be necessary, but may lead to improvement of the molecular weight of the film.

In a preferred embodiment, the plasma temperature is at most 50° C., more preferably at most 40° C., still more preferably at most 30° C. and most preferably around room temperature.

In a preferred embodiment, the plasma temperature is controlled, more preferably by cooling electrodes used for ionizing the plasma gas. This can be e.g. water-cooled or air-cooled electrodes. Preferably the temperature of the electrodes is measured and/or the temperature of the substrate is measured in order to allow better control the temperature of the plasma gas. Typically this can be achieved by using a temperature control system, e.g. a PID controlling system, which allows to steer the cooling of the plasma, e.g. by cooling the electrodes, by checking how a predetermined desired plasma temperature relates to the measured temperature. Preferably the temperature of the electrodes and of the substrate is measured and the temperature control system ensures that the desired plasma temperature lies between the electrode temperature and the substrate temperature.

The substrates which can be treated with the present invention may have any type of shape and size, and may be substrates which are difficult to bond, due to their inert nature or their extreme fragility (such as natural materials, or biodegradable/water soluble materials), for example:

Polymers:
Commodities (e.g. PE, PP, PVC, PS, EPDM, polyolefins . . . )
Engineering thermoplastics (e.g. PET, PBT, PMMA, PC, PES, polyamides, aramides, Acrylonitrile styrene acrylate (ASA), acrylonitrile butadiene styrene (ABS), . . . )
Fluorinated polymers (e.g. PTFE, PVDF, Fluorinated ethylene propylene (FEP), . . . )
Biodegradable polymers (e.g. PLA, PCL, . . . )
Cross-linked polymers (e.g. epoxy-amines, polyurethanes, silicones, . . . )
Carbon fibres
Water soluble polymers (PEG, polyvinyl pyrrolidone (PVP), polyvinyl alcohol (PVA), polyacrylic acid (PAA), polyacrylamides, divinyl ether-maleic anhydride (DIVEMA), polyoxazoline, polyphosphates, polyphosphazenes, . . . )
Natural materials: rayon or viscose, polysaccharides, chitosan, collagen, proteins, xanthan gum, pectins, dextran, carrageenan, guar gum, hyaluronic acid (HA), leather . . .
Metals: Gold, silver, iron, brass, lead, iron, copper, tin, stainless steel, aluminium, zinc, . . . (including all possible alloys)
Ceramics: Glass, silicon wafers, metal oxides (e.g. Al2O3, ZnO, . . . ), carbides (e.g. SiC, titanium carbide, . . . ), nitrides (e.g. Si3N4, . . . )

In preferred embodiments, the substrates comprise any or any combination of the following:
polymer materials such as polymers, co-polymers, co-extruded polymers, e.g. polyamide (PA) fiber, PA staple fiber, PA yarn, PA fabric, PA6 fiber, PA6 staple fiber, PA6 yarn, PA6 fabric, PA66 fiber, PA66 staple fiber, PA66 yarn, PA66 fabric, polybutadiene terephthalate (PBT), Polyethylene terephthalate (PET) foil, PET fabric, PET fiber, aramid fabric, aramid textile, aramid fiber, polycarbonate, Poly(methyl methacrylate) (PMMA), rayon fiber, silicone, Teflon, Teflon foil, carbon fiber, unsized carbon fiber, Ethylene Fluorinated Ethylene Propylene (EFEP), EFEP films, para-aramid fabric, acrylonitrile styrene acrylate (ASA), acrylonitrile butadiene styrene (ABS), polyvinylchloride (PVC), ethylene-tetrafluorethylene copolymer (ETFE), ETFE film, polypropylene (PP),
and combinations thereof, such as co-extruded PA6 and PBT, co-extruded PBT and PC, co-extruded ASA and PC, co-extruded PC and ABS
ceramic materials such as glass and/or enamel, glass fiber, unsized glass fiber
metallic materials such as alloys, more preferably steel, low-tinned steel (LTS)

The precursor used in the present invention preferably is an organic precursor. If an increased adhesion is desired, the precursor preferable comprises any or any combination of the following groups: hydroxyl-functional groups, amines, primary amines, isocyanates and/or epoxy-functional groups. In a preferred embodiment, the precursor comprises any of the following substances as arranged in the table below:

| Name | CAS nr | Chemical composition |
|---|---|---|
| *Hydroxyl-based* | | |
| Acrylic acid | 79-10-7 | $H_2C{=}CH{-}C({=}O){-}OH$ |
| 2-Hydroxyethyl methacrylate (HEMA) | 868-77-9 | $H_2C{=}C(CH_3){-}C({=}O){-}O{-}CH_2CH_2{-}OH$ |
| Poly(ethylene glycol) methacrylate (PEGMA) | 25736-86-1 | $H_2C{=}C(CH_3){-}C({=}O){-}[O{-}CH_2CH_2]_n{-}OH$ |
| N-Hydroxyethyl acrylamide (HEAA) | 7646-67-5 | $CH_2{=}CH{-}C({=}O){-}NH{-}CH_2CH_2{-}OH$ |
| cis-2-Butene-1,4-diol (BUDIOL) | 6117-80-2 | $HO{-}CH_2{-}CH{=}CH{-}CH_2{-}OH$ |
| Pentaerythritol triacrylate (PETA) | 3524-68-3 | $H_2C{=}CH{-}C({=}O){-}O{-}CH_2{-}C(CH_2OH)(CH_2{-}O{-}C({=}O){-}CH{=}CH_2)_2$ with three acrylate groups and one OH |
| Polyvinylalcohol (PVA) | 9002-89-5 | $[{-}CH_2{-}CH(OH){-}]_n$ |
| Poly(vinyl alcohol-co-ethylene) (EVOH) | 25067-34-9 | $[{-}CH_2{-}CH(OH){-}]_m[{-}CH_2{-}CH_2{-}]_n$ |
| *Amine-based* | | |
| (3-Aminopropyl) triethoxysilane | 919-30-2 | $(H_3C{-}CH_2{-}O)_3Si{-}CH_2CH_2CH_2{-}NH_2$ |
| N-[3-(Trimethoxysilyl)propyl]ethylenediamine | 1760-24-3 | $(H_3CO)_3Si{-}CH_2CH_2CH_2{-}NH{-}CH_2CH_2{-}NH_2$ |
| N-(3-Trimethoxysilylpropyl)diethylenetriamine | 35141-30-1 | $(H_3CO)_3Si{-}CH_2CH_2CH_2{-}NH{-}CH_2CH_2{-}NH{-}CH_2CH_2{-}NH_2$ |

| Name | CAS nr | Chemical composition |
|---|---|---|
| *Isocyanate-based* | | |
| 2,6-dimethylphenyl isocyanate | 28556-81-2 | |
| Toluene 2,4-diisocyanate | 584-84-9 | |
| 4,4'-Methylenebis (phenylisocyanate) | 101-68-8 | |
| (Trimethylsilyl)isocyanate (TMOS-ISO) | 1118-02-1 | |
| 3-(Triethoxysilyl)propyl isocyanate (TEOS-ISO) | 24801-88-5 | |
| *Epoxy-based* | | |
| Glycidyl methacrylate | 106-91-2 | |
| (3-Glycidyloxypropyl) trimethoxysilane | 2530-83-8 | |

Also the following substances can be used as precursor: methacrylic acid, allylamine, allylmethacrylate, hydroxyethylacrylate, 2,4,6,8-Tetramethyl-2,4,6,8-tetravinylcyclotetrasiloxane (CAS 2554-06-5), 3-Mercaptopropyl trimethoxysilane (CAS 4420-74-0), Vinyltriethoxysilane (CAS 78-08-0), Maleic anhydride (CAS 108-31-6).

The precursors mentioned here above are particularly suitable for increasing the adhesion properties of a multitude of substrates, in particular of glass and/or ceramics. Substrates treated with the method according to the present invention using any of said precursors show particularly strong adhesion to a polyurethane (PU) layer, a 1-component PU layer and/or a 2-component PU layers. Such PU layers may typically be adhesive layers, such as gluing layers, which can be used to glue different components together. In cases where the PU glue does not stick very well to one of the components, this component can be treated with the method according to the present invention such that the adhesion to the PU glue improves.

Example 1: Plasma Treated Textile Reinforcement Material and Method of Producing Such Reinforcement Material The invention can be applied for manufacturing a reinforcement material, in particular a tire cord or tire cord fabric, whereas a textile cord is being provided, the textile cord is being treated by atmospheric plasma in combination with an organic precursor, preferably comprising a polyisocyanate in accordance with the invention, to be grafted on the plasma treated and therefore modified surface of the cord, resulting in an increased adhesive capability to a latex/rubber comprising matrix, and the cord being treated in such a way is then contacted with the latex/rubber matrix.

Textile cords have been widely used as reinforcement materials in radial tires, conveyor belts, hoses or driving belts. The reinforcing character of the material is mainly effected by the structure of the cord consisting of several filaments being twisted together. Besides such more or less linear cord structures (so called "single end cords"), cords can also be used in the form of laminar structures, e.g. as woven structures (so called "fabric").

The filaments can be made of different types of synthetic high-tenacity polymeric fibers like e.g. polyesters such as polyethylene terephthalate (PET) or polyethylene naphthalene (PEN), aromatic or aliphatic polyamides like Aramid or Nylon, respectively, but also of regenerated cellulose fibers. Non-textile materials like steel fibers, carbon fibers or glass fibers can also be taken into consideration as reinforcing material. Fiber blends e.g. commingled yarns or hybrid constructions of different fiber types can also be used as well as monofilament constructs of one fiber type wrapped with filaments of another fiber type. Due to the different chemical structure of the polymer fibers, those reinforcement materials show different adhesive properties with respect to the tire rubber to which they are bonded in the vulcanization step.

It is of course the intention to have a strong bonding between the textile cord and the rubber in order to guarantee structural integrity of the tire in use and to avoid separation of the cord from the rubber.

In order to improve the adhesion between the textile cord and the tire rubber during the vulcanization process, currently the cord is dipped with a mixture, mostly comprising Resorcinol, Formaldehyde and Latex (RFL-dip), before vulcanization. In many cases—depending on the nature of the fibers used—the additional application of a pre-dip coating consisting of in particular a mixture of blocked isocyanates and low molecular epoxies to the fiber, followed by the said RFL-dip is necessary to increase the reactivity of the reinforcement material which then guarantees an adequate adhesion between the tire cord and the rubber. This is the case for aramid and polyester cords, and their combinations (e.g. hybrids, commingled materials).

However, the additional pre-dipping step leads to the unwanted effect of an increased weight of the dipped cord, besides higher process complexity and higher costs compared to single-bath dipping with an RFL dip only. Regarding the RFL dip, resorcinol as well as formaldehyde are said to negatively affect human health due to potential detrimental i.a. carcinogenic effects. Therefore, it has been the goal to develop alternatives to improve adhesion without the need of hazardous substances like resorcinol and/or formaldehyde and without the need of a multi-stage dipping process.

Wet chemistry methods using highly concentrated acid or alkali, as well as plasma treatment methods using different kinds of plasma have been applied for surface activation or modification of textile fibers in order to improve their hydrophilicity and therefore adhesion of the cord to the RFL dip and rubber, respectively. Both treatment methods may have an etching effect on the fiber, morphological and topological changes are not limited to the fiber surface but can also occur inside of the fiber which then results in a weakening of physical fiber properties e.g. breaking force and tenacity.

However, the use of atmospheric plasma has the advantage that due to the low energy input needed, it does not negatively affect the dynamometric properties and the structure of the fibers. Besides the further advantage that no high pressure or—on the other hand—no vacuum and therefore no specific installation regarding pressure or vacuum generation is needed, this method allows plasma generation at low temperature, from room temperature to 250° C., but preferably limited to at most 50° C. One way to use such plasma is the plasma-assisted polymerization and deposition of organic precursor substances onto the fiber surface.

It has now surprisingly been found that by using polyisocanates, preferably diisocyanates as precursor substance in a plasma-assisted polymerization and deposition step, in combination with a subsequent latex dipping step, the use of hazardous substances like resorcinol and formaldehyde in a subsequent dip solution as well as the need for an additional pre-dip can be completely avoided.

The present invention provides a method for treating textile reinforcement materials, in particular tire cords in such a way that the fibers of the reinforcement material can be modified and/or coated with an organic precursor material to be polymerized on the surface of the fibers during plasma treatment to improve their adhesion to the rubber matrix in one single dipping step, without the use of resorcinol/formaldehyde.

One way to generate atmospheric plasma is via dielectric barrier discharges (DBD) whereby—either in a cylindrical or in a rectangular arrangement—at least two concentric or parallel electrodes are separated by a gap of some millimeters and a dielectric barrier is disposed between the electrodes. A power source is providing alternating current (ac) voltage to the electrodes with the effect that a dielectric barrier discharge takes place between the dielectric barrier and the inner electrode. The electrical power applied is in the range of between 20 and 500 W, preferably between 50 and 450 W. The generation of the atmospheric plasma typically occurs in the presence of an oxidizing or non-oxidising gas ("plasma gas"), like $N_2$, Ar, He, Ne, $O_2$, $CO_2$, $O_2$, $N_2O$, $CF_4$, $SF_6$, or mixtures thereof. Preferably, the gas is non-oxidizing and/or free of oxygen, e.g. N2, Ar, He or Ne in order to better control the adhesion properties and/or to avoid incorporation of plasma gas molcules or plasma gas atoms int the coating. The plasma gas is fed to the plasma reactor and is being excited by the electric discharge which results in a conversion to the plasma state. The plasma propagates through the elongated space through which the plasma gas is fed, towards the lower open end of the plasma reactor where it can be ejected through a nozzle to treat the tire cord. An example of a device used for this invention is disclosed in WO2006081637A1.

The flow rate of the plasma gas is between 1 and 100 slpm, preferably between 40 and 90 slpm, most preferably between 50 and 80 slpm.

In a preferred embodiment, the plasma generated via DBD has a temperature <100° C. ("cold plasma") and even more preferred <50° C. In a most preferred embodiment, plasma generation is performed at room temperature.

Regarding the use of polyisocyanates as organic precursor compounds, they preferably comprise "unblocked" or "blocked" isocyanates. "Blocked" isocyanates are reaction products of isocyanates with, for example, phenols, oximes, caprolactam or β-dicarbonyl compounds, which thermally dissociate at higher temperature to set free the original isocyanate group. Furthermore the blocked isocyanates are stable when in contact with water e.g. in dip solutions. Since during the atmospheric plasma treatment no water is present, unblocked polyisocyanates can be used as well.

Preferably, the polyisocyanates are diisocyanates. More preferably, the polyisocyanates are from the group of diphenyl diisocyanates, most preferably from the group of methylene diphenyl diisocyanates (MDI).

As latex, there is used at least one compound selected from the group of vinyl-pyridine (VP) latex, styrene-butadiene (SBR) latex, carboxylated styrene-butadiene (XSBR) latex, natural rubber (NR) latex or combinations thereof, e.g. a styrene butadiene vinylpyridine latex. The total solid content inside the latex compound is between 10 to 40 wt %, preferably between 10 and 20 wt %. The latex dip is prepared by diluting the concentrated latex emulsion with soft water to a total solid content of 20 wt %.

Experimental Design:

The following commercially available cord materials were treated according to this invention: Polyester (3340×2 dtex), Aramid (1670×2 dtex).

50 cm of each cord sample were irradiated by plasma generated in a PlasmaSpot® device from Molecular Plasma Group, Luxembourg, using a custom-made fiber nozzle at a treatment line speed of 4 m/min. The cord samples were passed between 1 and 10 times through the plasma. The Power applied was varied between 60 Watt and 250 Watt.

As a precursor, Yokohama Hamatite GPI-1650-B primer comprising methylene diphenyl diisocyanate was used. It was fed into the plasma device at a rate of 1 to 10 g per hour per cord in liquid state in the form of an aerosol. The treated cords were then dipped in a dipping bath containing a styrene butadiene vinylpyridine latex (Omnova Pliocord VP106S) with a total solid content of 20% on a standard tire cord dipping line and dried in three subsequent ovens at 150° C., 230° C. and 230° C. respectively with a residence time of 50 seconds in each oven.

Yokohama Hamatite GPI-1650-B primer is a mixture comprising 25-50% ethyl acetate and 10-25% 4,4'-methylene diphenyl diisocyanate.

The effect of the plasma-assisted polymerization of the polyisocyanates in combination with the latex-dip on the adhesion of the tire cord was measured by cord-to-rubber adhesion (CRA). CRA was tested by preparing a test sample where five cords were embedded within a surface layer of a rubber sheet and vulcanized for 30 minutes at a temperature of 150° C. while applying pressure to the rubber. Subsequently, a load was applied to the cords until they were peeled from the rubber sheet. The value of this load therefore corresponds to the cord-to-rubber adhesion.

For comparison, adhesion values of plasma treated cords without subsequent dipping in a latex comprising solution were measured. Such direct bonding showed remarkably lower and therefore unsatisfactory adhesion values. The subsequent application of a dip containing latex to the plasma treated cords is hence essential in the context of this example.

Further reference samples were prepared and tested without the step of plasma-polymerization/deposition, but with the subsequent latex dipping step.

Experimental Results:

PET 3340x2 dtex

| | Power (W) | Plasma Gas | Plasma gas flow (slm) | Number of passes | Concentration of precursor (% of original Yokohama primer solution) | Latex dip | CRA value (N/cord) |
|---|---|---|---|---|---|---|---|
| Sample 1 | 250 | $N_2$ | 80 | 10 | 100% | yes | 8.7 |
| Sample 2 | 60 | Ar | 60 | 10 | 25% | yes | 10.0 |
| Sample 3 | 60 | Ar | 60 | 1 | 25% | yes | 5.2 |
| Comparative sample 1 | 250 | $N_2$ | 80 | 10 | 100% | no | 1.8 |
| Comparative sample 2 | 60 | Ar | 60 | 10 | 25% | no | 1.6 |
| Comparative sample 3 | 60 | Ar | 60 | 1 | 25% | no | 1.5 |
| Comparative sample 4 | No plasma | | | | | yes | 3.3 |

Aramid 1670x2 dtex

| | Power (W) | Plasma Gas | Plasma gas flow (slm) | Number of passes | Concentration of precursor (% of original Yokohama primer solution) | Latex dip | CRA value (N/cord) |
|---|---|---|---|---|---|---|---|
| Sample 1 | 60 | Ar | 60 | 1 | 100% | yes | 4.7 |
| Sample 2 | 60 | Ar | 60 | 3 | 100% | yes | 5.2 |
| Sample 3 | 60 | Ar | 60 | 6 | 100% | yes | 5.0 |
| Sample 4 | 250 | $N_2$ | 80 | 1 | 100% | yes | 5.2 |
| Sample 5 | 250 | $N_2$ | 80 | 3 | 100% | yes | 11.7 |
| Sample 6 | 250 | $N_2$ | 80 | 6 | 100% | yes | 8.9 |
| Sample 7 | 250 | $N_2$ | 80 | 1 | 25% | yes | 9,2 |
| Sample 8 | 250 | $N_2$ | 80 | 3 | 25% | yes | 11.7 |
| Sample 9 | 250 | $N_2$ | 80 | 6 | 25% | yes | 8.0 |

All comparative aramid samples (direct bonding without latex dip) showed adhesion values between 0.6 and 1.6 N/cord. The reference sample without plasma treatment but with latex dip resulted in an adhesion value of only 2.8 N/cord.

For both cord materials an increased adhesion could be observed by the combined effect of plasma assisted polymerization/deposition using polyisocyanates as precursor and a latex dip. Regarding PET, low power value for plasma generation (60 W) and a relatively low precursor amount (25% of the original concentration) were sufficient to reach adhesion values more than five times higher than the comparative sample with no latex dip.

Regarding the aramid cord, best adhesion results could be reached by using a power value of 250 W and a relatively low number of passes through the plasma. Also in this case, a relatively low precursor concentration (25% of the original concentration) seems to be sufficient to reach the same adhesion values as with the original concentration.

Example 2: Further Examples

Adhesion between a PA6 substrate and a 1-component (1K) PU glue was seen to improve by treating the substrate with the method according to the present invention using (3-Aminopropyl) triethoxysilane (CAS 919-30-2) and/or 4,4'-Methylenebis(phenyl isocyanate) (CAS 101-68-8) as precursor. Stress tests showed that the failure was a cohesive failure, i.e. a failure within the different components, and was not due to the adhesion between substrate and glue.

Adhesion between a PBT substrate and a 1-component (1K) PU glue was seen to improve by treating the substrate with the method according to the present invention using 4,4'-Methylenebis(phenyl isocyanate) (CAS 101-68-8) as precursor. Stress tests showed that the failure was a cohesive failure, i.e. a failure within the different components, and was not due to the adhesion between substrate and glue.

Adhesion between a glass substrate and a 1-component (1K) PU glue was seen to improve by treating the substrate with the method according to the present invention using (3-Aminopropyl) triethoxysilane (CAS 919-30-2) and/or 1-(3-Trimethoxysilylpropyl)diethylenetriamine (CAS 35141-30-1) as precursor. Stress tests showed that the failure was a cohesive failure, i.e. a failure within the different components, and was not due to the adhesion between substrate and glue.

Adhesion between an enamel substrate and a 1-component (1K) PU glue was seen to improve by treating the substrate with the method according to the present invention using (3-Aminopropyl) triethoxysilane (CAS 919-30-2) and/or 1-(3-Trimethoxysilylpropyl)diethylenetriamine (CAS 35141-30-1) as precursor. Stress tests showed that the failure was a cohesive failure, i.e. a failure within the different components, and was not due to the adhesion between substrate and glue.

Adhesion between a glass substrate and a 2-component (2K) PU glue was seen to improve by treating the substrate with the method according to the present invention using 1-(3-Trimethoxysilylpropyl)diethylenetriamine as precursor. Stress tests showed that the failure was a cohesive failure, i.e. a failure within the different components, and was not due to the adhesion between substrate and glue.

Adhesion between an enamel substrate and a 2K PU glue was seen to improve by treating the substrate with the method according to the present invention using (3-Aminopropyl) triethoxysilane (CAS 919-30-2) and/or 1-(3-Trimethoxysilylpropyl)diethylenetriamine (CAS 35141-30-1) as precursor. Stress tests showed that the failure was a cohesive failure, i.e. a failure within the different components, and was not due to the adhesion between substrate and glue.

Adhesion between a PC substrate and a 2K PU glue was seen to improve by treating the substrate with the method according to the present invention using (3-Aminopropyl) triethoxysilane (CAS 919-30-2) and/or 1-(3-Trimethoxysilylpropyl)diethylenetriamine (CAS 35141-30-1) as precursor. Stress tests showed that the failure was a cohesive failure, i.e. a failure within the different components, and was not due to the adhesion between substrate and glue.

Adhesion between a PMMA substrate and a 2K PU glue was seen to improve by treating the substrate with the method according to the present invention using 2-Hydroxyethyl methacrylate (CAS 868-77-9) and/or 1-(3-Trimethoxysilylpropyl)diethylenetriamine (CAS 35141-30-1) as precursor. Stress tests showed that the failure was a cohesive failure, i.e. a failure within the different components, and was not due to the adhesion between substrate and glue.

Adhesion between a PET fabric and Nitrilbutadiene elastomer (NBR) was seen to improve by treating the substrate with the method according to the present invention using 1-(3-Trimethoxysilylpropyl)diethylenetriamine as precursor. Stress tests showed slight improvement.

Adhesion between a Aramid fabric and ethylene propylene diene monomer rubber (EPDM) was seen to improve by treating the substrate with the method according to the present invention using 2,4,6,8-Tetramethyl-2,4,6,8-tetravinylcyclotetrasiloxane (CAS 2554-06-5) and/or 3-Mercaptopropyl trimethoxysilane (CAS 4420-74-0) as precursor. Stress tests showed significant improvement.

Adhesion between a Aramid fabric and fluorinated silicone was seen to improve by treating the substrate with the method according to the present invention using Vinyltriethoxysilane (CAS 78-08-0) as precursor. Stress tests showed significant improvement.

Adhesion between rayon and natural rubber was seen to improve by treating the substrate with the method according to the present invention using 4,4'-Methylenebis(phenyl isocyanate) (CAS 101-68-8) and/or 3-Mercaptopropyl trimethoxysilane (CAS 4420-74-0) as precursor. Stress tests showed significant improvement.

Adhesion between aramid and natural rubber was seen to improve by treating the substrate with the method according to the present invention using 4,4'-Methylenebis(phenyl isocyanate) (CAS 101-68-8) as precursor. Stress tests showed significant improvement.

Adhesion between PET and natural rubber was seen to improve by treating the substrate with the method according to the present invention using 4,4'-Methylenebis(phenyl isocyanate) (CAS 101-68-8) and/or 3-Mercaptopropyl trimethoxysilane (CAS 4420-74-0) as precursor. Stress tests showed significant improvement.

Adhesion between an EFEP substrate and a Nitrilbutadiene elastomer (NBR) was seen to improve by treating the substrate with the method according to the present invention using 2-Hydroxyethyl methacrylate (CAS 868-77-9) as precursor. Stress tests showed drastic improvement.

Adhesion between a PET substrate and overmoulded PP was seen to improve by treating the substrate with the method according to the present invention using Maleic anhydride (CAS 108-31-6) as precursor. Stress tests showed clear improvement.

Adhesion between a substrate of co-extruded PBT and PC material and 1K and 2K PU glue was seen to improve by treating the substrate with the method according to the present invention using 2-Hydroxyethyl methacrylate (CAS 868-77-9) and/or 4,4'-Methylenebis(phenylisocyanate) (CAS 101-68-8) as precursor. Stress tests showed clear improvement.

Adhesion between a substrate of co-extruded PC and ABS material and 1K and 2K PU glue was seen to improve by treating the substrate with the method according to the present invention using 2-Hydroxyethyl methacrylate (CAS 868-77-9) and/or 4,4'-Methylenebis(phenylisocyanate) (CAS 101-68-8) as precursor. Stress tests showed clear improvement.

Adhesion between a substrate of co-extruded ASA and PC material and 1K and 2K PU glue was seen to improve by treating the substrate with the method according to the present invention using 2-Hydroxyethyl methacrylate (CAS 868-77-9) and/or 4,4'-Methylenebis(phenylisocyanate) (CAS 101-68-8) as precursor. Stress tests showed clear improvement.

The invention claimed is:

1. A method for altering adhesion properties of a surface of a substrate with respect to a second surface by a coating, comprising the steps of:
   a) ionizing a plasma gas at low temperature and at atmospheric pressure, thereby creating a plasma with a plasma temperature of at most 50° C.; wherein the plasma gas is ionized via a direct barrier discharge (DBD) by providing an AC voltage to create the DBD;
   b) introducing a precursor into a plasma gas afterglow of said plasma;
   c) subjecting the surface of the substrate to said plasma comprising said precursor, thereby forming a coating onto said surface, wherein said plasma gas is essentially completely comprised of inert gas, wherein the plasma gas is provided at a plasma gas flow of between 40 slpm to 90 slpm, and
wherein said coating alters the adhesion properties of the surface of the substrate with respect to the second surface, wherein the substrate is not in a plasma zone and/or does not pass through a plasma zone, said plasma zone being a zone where plasma is induced,
wherein the precursor comprises an isocyanate functional group.

2. The method according to claim 1, wherein the precursor is selected to increase the adhesion of the surface by the coating.

3. The method according to claim 1, wherein the precursor is introduced as an aerosol or as a gas.

4. The method according to claim 1, wherein said plasma gas comprises inert gas for at least 99% by volume.

5. The method according to claim 1, wherein said plasma gas comprises O2 for at most 1% by volume.

6. The method according to claim 1, wherein said inert gas is a noble gas.

7. The method according to claim 1, wherein said inert gas is a non-noble gas.

8. The method according to claim 1, wherein said plasma gas is ionized by means of electrodes.

9. The method according to claim 8, wherein the plasma gas is ionized by said electrodes with a power in a range of 2.5 and 7.5 $W/cm^2$.

10. The method according to claim 1, wherein the substrate moves during step c.

11. The method according to claim 1, wherein the substrate is static during step c.

12. The method according to claim 1, wherein said substrate undergoes a plasma pre-treatment step prior to being subjected to the plasma comprising the precursor.

13. The method according to claim 1, wherein the precursors further comprises any or any combination of the following groups: hydroxyl-functional groups, amines, primary amines, and/or epoxy-functional groups.

14. A method for altering adhesion properties of a surface of a substrate with respect to a second surface by a coating, comprising the steps of:
   a) ionizing a plasma gas at low temperature and at atmospheric pressure, thereby creating a plasma with a plasma temperature of at most 50° C., wherein the plasma gas is ionized via a direct barrier discharge (DBD) by providing an AC voltage to create the DBD;
   b) introducing a precursor into a plasma gas afterglow of said plasma;
   c) subjecting the surface of the substrate to said plasma comprising said precursor, thereby forming a coating onto said surface, wherein said plasma gas is essentially completely comprised of inert gas, wherein the plasma gas is provided at a plasma gas flow of between 50 and 1500 slpm, and
wherein said coating alters the adhesion properties of the surface of the substrate with respect to the second surface, wherein the substrate is not in a plasma zone and/or does not pass through a plasma zone, said plasma zone being a zone where plasma is induced.

* * * * *